United States Patent [19]

Jansson

[11] Patent Number: 4,958,090
[45] Date of Patent: Sep. 18, 1990

[54] NON-CURRENT HOGGING DUAL PHASE SPLITTER TTL CIRCUIT

[75] Inventor: Lars G. Jansson, Long Island, Me.

[73] Assignee: National Semiconductor Corporation, Santa Clara, Calif.

[21] Appl. No.: 320,281

[22] Filed: Mar. 6, 1989

[51] Int. Cl.$^5$ .................. H03K 3/286; H03K 19/003; H03K 19/088

[52] U.S. Cl. .................................... 307/456; 307/291; 307/491

[58] Field of Search ............... 307/456, 466, 467, 291, 307/473, 491

[56] References Cited

U.S. PATENT DOCUMENTS

| | | | |
|---|---|---|---|
| 3,591,856 | 7/1971 | Kalb | 307/456 |
| 4,255,670 | 3/1981 | Griffith. | |
| 4,287,433 | 9/1981 | Goodspeed. | |
| 4,661,727 | 4/1987 | Ferris et al.. | |
| 4,677,320 | 6/1987 | Hannington. | |
| 4,698,525 | 10/1987 | Tavana et al. | 307/456 |
| 4,777,391 | 10/1988 | Shin | 307/456 |
| 4,855,622 | 8/1989 | Johnson | 307/456 |

*Primary Examiner*—John Zazworsky
*Attorney, Agent, or Firm*—Lee Patch; Daniel H. Kane

[57] ABSTRACT

Dual phase splitter transistor elements, an output phase splitter transistor element and a secondary phase splitter transistor element, are coupled in current mirror configuration in a TTL output buffer circuit. The output phase splitter transistor element is coupled to the pullup and pulldown transistor elements for controlling the respective conducting states of the pullup and pulldown transistor elements. The collector of the secondary phase splitter transistor element is coupled in a supplemental circuit which can have a variable load without direct connection to the pullup transistor element and output. A low impedance current sourcing active transistor element is coupled in emitter follower configuration at the collector node of the secondary phase splitter transistor element for supplying mirroring current through the emitter of the secondary phase splitter transistor element to reduce current hogging at the dual phase splitter transistor elements. The current sourcing transistor element is coupled in parallel with the supplemental circuit thereby providing a variable current which varies inversely with the collector current supplied by the supplemental circuit. The invention is applied in a JK flip flop circuit as the output buffer circuits with the collector of the secondary phase splitter transistor element coupled to the cross feedback circuit. The cross feedback transistor element in the cross feedback circuit is therefore isolated from the pullup transistor element and output avoiding feedback transistor breakdown when the output is at high potential. The current sourcing transistor element prevents current hogging between the dual phase splitter transistor elements.

25 Claims, 3 Drawing Sheets

NON-CURRENT HOGGING DUAL PHASE SPLITTER TTL CIRCUIT

TECHNICAL FIELD

This invention relates to TTL circuits such as TTL buffer circuits and output devices having dual transistor elements coupled in current mirror configuration. The present invention provides a dual phase splitter TTL circuit with current mirroring at the emitters of the dual phase splitters but without current hogging at the bases of the dual phase splitters. The invention is applied in an improved JK flip flop circuit to prevent feedback transistor breakdown and to improve the circuit operating characteristics.

BACKGROUND ART

In U.S. Pat. No. 4,287,433 Steven N. Goodspeed introduced the basic dual phase splitter TTL circuit configuration useful for example in TTL output buffers and output devices. Such TTL output buffer circuits have an output for delivering data signals of high and low potential, a pulldown transistor element for sinking current from the output to ground, a pullup transistor element for sourcing current to the output from a power supply, and a phase splitter transistor element operatively coupled to the pullup and pulldown transistor elements. The phase splitter transistor element controls the conducting states of the respective pullup and pulldown transistor elements in accordance with signals at the input of the buffer circuit. According to the Goodspeed invention, multiple phase splitter transistor elements are coupled substantially in parallel configuration between the input and the pulldown transistor element. Typically, dual phase splitters, i.e., two phase splitter transistor elements, are incorporated in the buffer circuit or output device. However as used in this specification and in the claims the word "dual" is intended to mean "multiple" and to include either two or more transistor elements.

One of the dual phase splitters, designated for example the output phase splitter transistor element, is coupled to both the pullup and pulldown transistor elements for "phase splitting". The output phase splitter transistor element simultaneously controls the pullup and pulldown transistor elements in opposite conducting states in response to input signals. The emitter nodes of the dual phase splitter transistor elements are jointly coupled in parallel to control the pulldown transistor element. The base drives are also coupled in parallel. However, only the collector node of the output phase splitter transistor element is coupled to the pullup transistor element. The collector node of the secondary or supplemental phase splitter transistor element is available to perform other circuit functions disconnected from the pullup transistor element and the output.

For example in the Goodspeed U.S. Pat. No. 4,287,433 the output phase splitter transistor element coupled to both the pullup and pulldown transistor elements is in turn coupled to the power supply $V_{cc}$ through a relatively high collector resistance. The collector node of the secondary phase splitter transistor element, disconnected from the pullup transistor element, is coupled to the power supply $V_{cc}$ through a relatively low collector resistance. The dual phase splitter transistor elements jointly define in parallel a relatively low collector resistance path from high potential. The current derived from this parallel path drives the pulldown transistor element for transition from high to low potential at the output and for maintaining the low potential state at the output of the device.

For a tristate TTL output device the enable gate is coupled to the base nodes of the dual phase splitter transistor elements and to the base of the node pullup transistor element. The enable gate provides a route to ground for disabling the various transistor elements in the high impedance third state. Because of the dual phase splitter configuration, however, the collector node of the secondary phase splitter transistor element with the relatively low collector resistance is not connected to the enable gate. Power consumption in the high impedance third state is therefore reduced and restricted to the small current passing through the relatively high collector resistance path of the output phase splitter transistor only.

In U.S. Pat. No. 4,255,670 the dual phase splitter TTL circuit configuration is used to accelerate sinking of current from the output to ground during transition from high to low potential at the output. A supplemental feedback circuit is coupled between the output and the collector node of the secondary phase splitter transistor element to drive the pulldown transistor element to greater conduction. Only the output phase splitter transistor element is coupled to both the pullup and pulldown transistor elements The enable gate is coupled to the base of the pullup transistor element at the collector node of the output phase splitter transistor only. The secondary phase splitter transistor element therefore blocks a path from the output to ground that would otherwise occur through the feedback circuit and through the enable gate. The use of dual phase splitters effectively disconnects the supplemental feedback circuit and output from the enable gate.

Such an application of the dual phase splitter circuit configuration however introduces a variable collector current through one of the dual phase splitter transistor elements. The dual phase splitter transistor elements are generally coupled in current mirror configuration, that is with the base nodes and emitter nodes respectively tied together in parallel. The current mirror configuration establishes equal emitter current densities through the transistor elements. With different or varying collector current to one of the transistor elements, the transistor with the lesser collector current may draw all of the base drive current in the process of equalizing emitter current densities, a phenomenon known as "current hogging". Such current hogging may effectively offset or negate the benefits of the supplemental circuit function performed by the secondary phase splitter transistor element. In the case of the tristate output feedback circuit, current hogging can destroy $\beta^2$ amplification and acceleration of sinking current from the output intended by the use of the feedback circuit.

More generally, in a current mirror configuration of multiple transistor elements, at least one of the transistor elements is arranged in the circuit with a fixed collector load and substantially constant emitter current density. This transistor element is referred to herein as the primary or reference transistor element, or the output transistor element. In the case of dual phase splitter TTL buffer and output circuits it is typically the output phase splitter transistor element. The other current mirror transistor element or elements may have a variable collector load and are referred to herein as the secondary or supplemental transistor elements. In the case of dual phase splitter TTL buffers and output devices it is typically referred to herein as the secondary phase splitter transistor element. The substantially constant emitter current density of the primary reference transistor element is "mirrored" in the emitter current density of the secondary transistor elements. It is in the process of "mirroring" that the variable collector load secondary phase splitter transistor elements may "hog" the base drive current and deprive the primary transistor element of necessary base drive current.

The problem of current hogging in dual phase splitter transistor element TTL circuits is resolved by David A. Ferris et.al. in U.S. Pat. No. 4,661,727 by departing from the current mirror configuration for the dual phase splitter transistor elements. Ferris et.al. provide independent base drives to multiple phase splitter transistor elements in a TTL tristate output circuit to prevent current hogging. The output phase splitter transistor element is coupled to both the pullup and pulldown transistor elements while the secondary phase splitter transistor element is coupled in the output feedback circuit to accelerate sinking of current through the pulldown transistor element with $\beta^2$ amplification of current. Separate and independent input base drive transistor elements are provided at the base of each phase splitter transistor element to prevent current hogging. This dual phase splitter TTL circuit configuration with independent base drives at the dual phase splitters is applied to advantage by Geoff Hannington in U.S. Pat. No. 4,677,320 for an ECL to TTL translator.

The present invention provides a novel circuit of dual transistor elements in current mirror configuration without current hogging. It also implements a novel application of the circuit as a dual phase splitter transistor element TTL output circuit to resolve problems encountered in the basic JK flip flop circuit and to improve the JK flip flop circuit operating characteristics. The problems in conventional JK flip flop circuits resolved by the present invention are briefly summarized as follows.

The invention is applied in the basic JK flip flop in order to solve the problem of feedback transistor breakdown encountered in conventional JK flip flops and to enhance generally the JK flip flop operating characteristics. The basic JK flip flop circuit is provided with J and K input circuits for receiving input signals of high and low potential. The J and K input circuits are also referred to as the "master" input circuits. Q and $\overline{Q}$ output buffer circuits have respective inputs operatively coupled to the respective J and K input circuits for controlling the states of the Q and $\overline{Q}$ outputs according to the J & K input signals. The Q and $\overline{Q}$ output circuits are also referred to as the "slave" output circuits. Each of the Q and Q output buffer circuits incorporate the elements of the standard TTL output circuit with a single phase splitter.

A first cross feedback circuit and first cross feedback transistor element is coupled between the J input circuit and a collector node of the phase splitter transistor element of the $\overline{Q}$ output buffer circuit. A second cross feedback circuit and second cross feedback transistor element is coupled between the K input circuit and a collector node of the phase splitter transistor element of the Q output buffer circuit. CLOCK, SET and CLEAR signal inputs are also provided. The logical operation of the JK flip flop is summarized in Table 1 as follows:

TABLE 1

| JK FLIP FLOP TRUTH TABLE | | | |
|---|---|---|---|
| J | K | $Q_{n+1}$ | $\overline{Q}_{n+1}$ |
| 0 | 0 | $Q_n$ | $\overline{Q}_n$ |
| 1 | 0 | 1 | 0 |
| 0 | 1 | 0 | 1 |
| 1 | 1 | $\overline{Q}_n$ | $Q_n$ |

The subscript n designates the present cycle or event at clock pulse n, while the subscript n+1 designates the next cycle or event after clocking, at clock pulse n+1.

When either of the outputs Q or $\overline{Q}$ is at high potential, the emitter of the corresponding cross feedback transistor is also pulled to the high potential level by the collector of the single phase splitter. The high voltage reverse bias at the emitter may result in emitter collector breakdown and emitter base breakdown of the cross feedback transistor as hereafter described in further detail. The reverse conduction at the cross feedback transistor may pulldown the output to a potential level below specifications. It also degrades AC switching speeds of the JK flip flop.

OBJECTS OF THE INVENTION

It is an object of the present invention to provide a new dual transistor element configuration TTL circuit having multiple transistor elements in current mirror configuration with substantially full current mirroring but without current hogging.

Another object of the invention is to provide dual phase splitter configuration TTL circuits where the secondary phase splitter transistor element performs a supplemental circuit function. The supplemental circuit may cause a variable collector load and variable collector current. Yet current mirroring between the dual phase splitter transistor elements may occur without current hogging at the base drives. The invention is thus intended to permit dual phase splitter transistor elements to operate with equal emitter current densities under variable collector loading and variable collector currents without current hogging at the base drives.

A further object of the invention is to provide an improved JK flip flop incorporating the new dual phase splitter TTL circuit configuration to prevent breakdown of the JK feedback transistors and generally improve operating characteristics of the JK flip flop. According to this object of the invention the cross feedback circuit between each master input circuit and respective slave output circuit component of the JK flip flop is isolated from the pullup transistor element and output by coupling through a secondary phase splitter transistor element in a dual phase splitter transistor element current mirror configuration. The current hogging protection feature is also incorporated.

DISCLOSURE OF THE INVENTION

In order to accomplish these results, the present invention, broadly conceived, provides a non-current hogging dual transistor element current mirror circuit with dual transistor elements coupled in current mirror configuration. The dual transistor element current mirror circuit includes a primary reference transistor element with a substantially fixed collector load, and a secondary transistor element which may have a variable collector load. The primary and secondary transistor elements are coupled in current mirror configuration with the base nodes and emitter nodes in parallel. According to the invention a low impedance current sourcing active transistor element is coupled in emitter follower configuration at the collector node of the secondary transistor element. The current sourcing emitter follower transistor element supplies mirroring current on demand for equalizing emitter current densities as the secondary transistor element collector load and collector current vary. This mirroring current is provided without current hogging at the base drives of the dual transistor elements.

In particular, the present invention provides a new TTL output buffer circuit with dual phase splitter transistor elements coupled in current mirror configuration. The low impedance current sourcing active transistor element is coupled in emitter follower configuration at the collector node of the secondary phase splitter transistor element for supplying mirroring current without current hogging at the base drives of the phase splitter transistor elements.

The TTL output buffer circuit includes an output for delivering signals of high and low potential, a pulldown transistor element for sinking current from the output to ground, and a pullup transistor element for sourcing current to the output from a power supply. The dual phase splitter transistor elements include an output phase splitter transistor element, also referred to as the reference or primary phase splitter transistor element, coupled to the pullup and pulldown transistor elements for controlling the respective conducting states of the pullup and pulldown transistor elements in response to input signals. At least one secondary phase splitter transistor element is coupled in current mirror configuration with the output phase splitter transistor element. This secondary phase splitter transistor element is part of a supplemental circuit. The additional or supplemental circuit is connected to the collector node of the secondary phase splitter transistor element and causes a variable collector load. The collector node of the secondary phase splitter transistor element is disconnected or isolated from the pullup transistor element and output.

In the basic circuit, the current sourcing transistor element is coupled in a substantial emitter follower configuration at the collector node of the secondary phase splitter transistor element. The current sourcing transistor element is coupled in parallel with the supplemental circuit also coupled to the collector node of the secondary phase splitter transistor element. Thus, the current sourcing transistor element forms one branch of parallel lines or circuits coupled to the collector node of the secondary phase splitter transistor element. The supplemental circuit forms another branch. These two branches or circuit lines are referred to herein as the "collector circuit" of the secondary phase splitter transistor element.

The emitter follower configuration of the current sourcing transistor is described as a "substantial" emitter follower coupling because a small current limiting resistor may be coupled to the collector node of the current sourcing transistor to limit the sourcing current to, for example, no greater than 10 mA internal current. Such a small current limiting collector resistor of, for example, 1 K ohms or less, does not substantially interfere in the emitter follower function and operation of the current sourcing transistor. However it serves to prevent excessive current in response to the current mirroring requirements of the dual transistor elements coupled in current mirror configuration.

A feature of this dual phase splitter TTL circuit configuration is that the supplemental circuit may function as a varying collector load generating a varying collector current without provoking current hogging by either of the dual phase splitter transistor elements. While the branch current may vary in the parallel line leading to the collector node of the secondary phase splitter transistor element from the supplemental circuit, the current sourcing transistor element generates a compensating current in the other parallel branch collector line to yield a substantially constant emitter current density at the emitter of the secondary phase splitter transistor element. This compensating current varies inversely with the collector load current from the supplemental circuit branch so that the net collector to emitter current remains substantially constant. In particular, it is the emitter current densities which are stabilized and the emitter current densities of the dual phase splitter transistor elements that are substantially equalized. As a result, current hogging at the base drives of the dual or multiple phase splitter transistor elements is avoided. The current sourcing transistor element effectively compensates for any imbalance in the collector load and collector currents of the dual phase splitter transistor elements.

An advantage of this dual phase splitter current mirror configuration according to the invention is that it is applicable where a supplemental circuit and supplemental circuit function such as a feedback circuit causes a variable collector load and delivers variable current into the collector of the secondary or supplemental phase splitter transistor element. The collector current may vary in this supplemental branch leading to the collector node. However, it is compensated by current generated by the current sourcing transistor element in the other parallel branch leading to the collector node to provide a substantially constant net emitter current. As a result, the emitter currents of the dual or multiple phase splitter transistor elements remain equalized or in substantially constant proportion in current mirror configuration without current hogging at the base drives. A feature of this arrangement is that the output primary phase splitter transistor element can continue to operate as a fixed current source performing the phase splitting function at the output.

The invention provides one phase splitter transistor element, of the dual transistor elements in current mirror configuration, with a fixed collector load. Thus, one of the dual phase splitter transistor elements has to have a fixed collector load. This is referred to as the reference or primary phase splitter transistor elements. The emitter current of the fixed collector load primary transistor element is then "mirrored" into the secondary phase splitter transistor elements, independent of the variable collector load of the secondary phase splitter transistor element or elements.

For dual transistor elements in current mirror configuration, it is not necessarily the emitter currents themselves that are equalized in response to the demands of current mirroring but rather the emitter current densities. For dual transistor elements with equal emitter areas, the emitter currents are also equalized in the process of equalizing emitter current densities. For dual transistor elements with unequal emitter areas, mirroring causes the emitter currents to stabilize at a substantially constant proportion related to the respective emitter areas.

According to the invention, the emitter area of the secondary phase splitter transistor element is formed slightly larger, for example up to 5% larger, than the emitter area of the primary phase splitter transistor element. Under a constant collector load, the emitter current density of the secondary dual transistor element is therefore slightly lower than the emitter current density for the primary dual transistor element. As a result, any current hogging that occurs will tend to occur at the secondary dual transistor element where the current sourcing transistor can provide compensating collector current. Thus, the unequal emitter areas favor the secondary phase splitter transistor element as the locus of current hogging.

Base drive to the current sourcing transistor element in emitter follower configuration is taken from the collector node of the input transistor element of the output buffer circuit. In the simple case of a single input stage transistor element, the voltage drop or difference between the collector node of the input transistor element and the collector node of the secondary phase splitter transistor element is therefore one $V_{be}$, also referred to as $\phi$. This corresponds with the potential difference of one $V_{be}$ between the base of the input transistor element and the base of the secondary phase splitter transistor element.

More generally in the case of an output buffer with multiple current amplification input transistor element stages, the number of voltage drops $V_{be}$ in the current sourcing emitter follower configuration sequence between the collector of the input transistor element and the collector of the secondary phase splitter transistor element should equal the number of voltage drops $V_{be}$ between the base of the input transistor element and the base of the secondary phase splitter transistor element. For example in the case of an output buffer circuit with two stages of current amplification at the input and a voltage drop of 2 $V_{be}$'s between the base of the input transistor element and the base of the secondary phase splitter transistor element, a diode can be coupled in series with the base node or emitter node of the current sourcing transistor element to provide an additional substantially equalizing voltage drop between the collector of the input transistor element and the collector of the secondary phase splitter transistor element. Alternatively, the current sourcing transistor element may be a Darlington transistor element pair providing a voltage drop of 2 $V_{be}$'s between the collector of the input transistor element and the collector of the secondary phase splitter transistor element when the transistors are conducting.

According to the invention each of the Q and $\overline{Q}$ output buffer circuits of a JK flip flop circuit comprises dual phase splitter transistor elements. An output phase splitter transistor element is coupled to the pullup and pulldown transistor elements of the output buffer circuit for controlling the respective states of the pullup and pulldown transistor elements. At least one secondary phase splitter transistor element is coupled in current mirror configuration with the output phase splitter transistor element. The secondary phase splitter transistor element is coupled at its collector node to the respective cross feedback circuit from the J or K input circuit without a direct connection to the pullup transistor element and output. The cross feedback transistor element of the cross feedback circuit from the respective J or K input circuit is thereby isolated from the pullup transistor element and the Q or $\overline{Q}$ output, and is therefore free to be clamped at a lower voltage level. Feedback transistor breakdown is therefore avoided when the output Q or $\overline{Q}$ is at high potential.

In the preferred example embodiment, a current sourcing transistor element is coupled in substantial emitter follower configuration at the collector node of the secondary phase splitter transistor element for supplying mirroring current through the emitter of the secondary phase splitter transistor element on demand. The current sourcing transistor element is coupled in parallel with the cross feedback circuit at the collector node of the secondary phase splitter transistor element to provide a compensating current which varies inversely with the cross feedback circuit collector load current. Faithful current mirroring is therefore achieved without current hogging at the base drives of the dual phase splitter transistor elements.

By clamping the base of the current sourcing transistor element either from $V_{cc}$ by diode drops, or from ground by diode stacking, the current sourcing transistor element also serves as a clamp. It holds the potential level at the collector of the secondary phase splitter transistor element and at the emitter of the cross feedback transistor element to a level below $V_{cc}$ which avoids emitter/collector and emitter/base breakdown. Alternatively, a separate clamp may be provided with reference to ground or to $V_{cc}$.

The base drive of the current sourcing transistor element may be provided by coupling the base node to the collector node of an input transistor element or stage of the output buffer circuit. The collector node for base drive coupling is selected so that there is one voltage drop $V_{be}$ difference between the base of the input transistor element and the base of the secondary phase splitter transistor element, and between the collector node of the input transistor element and the collector node of the secondary phase splitter transistor element.

Other features of the improved JK flip flop circuit include an additional AC Miller killer circuit coupled to the bases of the dual phase splitter transistor elements of each of the output buffer circuits for accelerating turn off of the dual phase splitter transistor elements during transition from low to high potential at the output. A biasing circuit may also be coupled between the emitter of the current sourcing transistor and ground to maintain the current sourcing transistor in a slightly conducting state.

Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
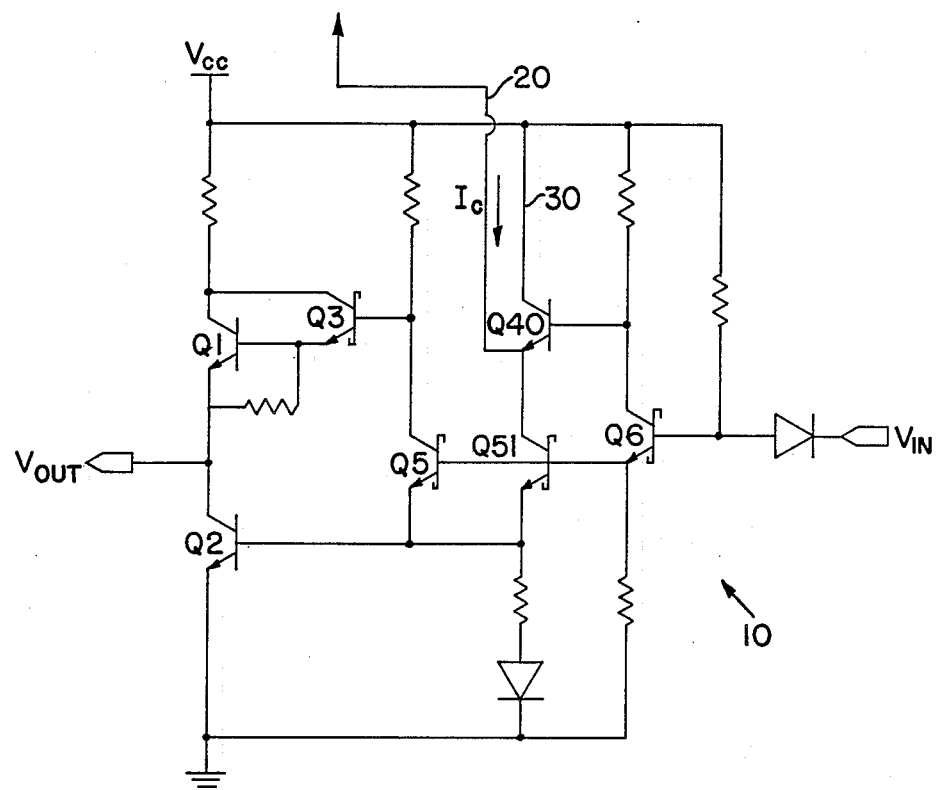
FIG. 1 is a simplified schematic block diagram of a dual phase splitter TTL output buffer circuit according to the invention.

A non-current hogging dual phase splitter inverting TTL output circuit is illustrated in FIG. 1 showing an input $V_{in}$ for receiving input signals of high and low potential and an output $V_{out}$ for delivering output signals after propagation through the device. The pullup transistor element is provided by Darlington transistor pair Q1, Q3 and sources current from the power supply $V_{cc}$ to the output $V_{out}$ when the output is in the high state. Pulldown transistor element Q2 sinks current from the output $V_{out}$ to ground when the output is in the low state. The phase splitter transistor element is provided by dual phase splitter transistor elements Q5 and Q51.

The output phase splitter transistor element Q5 is coupled to both the pullup and pulldown transistor elements for controlling the pullup and pulldown transistor elements in opposite conducting states in response to input signals at the input $V_{in}$ via input transistor Q6. The base nodes of the dual phase splitter transistors Q5 and Q51 are tied in parallel to the emitter node of input transistor Q6. The emitter nodes of dual phase splitter transistor elements Q5 and Q51 are tied together in parallel to the base of the pulldown transistor element Q2 for jointly driving the pulldown transistor element. As result the dual phase splitter transistor elements Q5 and Q51 are tied together in current mirror configuration.

The collector node of the supplemental or secondary phase splitter transistor Q51 is disconnected from the pullup transistor element. That is, it is not directly connected to the Darlington transistors Q1 and Q3, and the output $V_{out}$. Two parallel branches or circuit lines are connected to the collector node of the secondary phase splitter transistor Q51. The parallel branches are referred to herein as the collector circuit. A first branch 20 of the collector circuit of secondary phase splitter transistor element Q51 is therefore available for performing a supplemental circuit function such as feedback of signals as hereafter described. The supplemental circuit which it is desirable to isolate from the pullup transistor element and output of the output buffer circuit 10 is coupled in this first branch 20. In a parallel second branch 30 of the collector circuit of secondary phase splitter transistor Q51 is inserted the current sourcing transistor element Q40 coupled in emitter follower configuration between the power supply $V_{cc}$ and the collector node of the secondary phase splitter transistor element Q51.

With a variable collector load on the supplemental circuit line of collector circuit branch 20 a variable collector current $I_c$ flows through the secondary phase splitter transistor element Q51. If this collector current $I_c$ decreases relative to the collector current of output phase splitter transistor element Q5, the base of secondary phase splitter transistor Q51 then "hogs" the base drive current provided by input transistor element Q6. The consequent disruption in the operation of the output phase splitter transistor element Q5 may prevent operation of the output buffer circuit 10 in accordance with desired specifications.

However current sourcing transistor element Q40 coupled in emitter follower configuration without a collector resistor or with only a small collector resistor, for example 1 K ohms or less, represents a low impedance current sourcing element. It responds to the current mirroring requirements of the current mirror configuration dual phase splitter transistor elements Q5 and Q51. Current sourcing transistor element Q40 delivers a compensating collector current in collector circuit branch 30 which varies inversely with variations in the collector current $I_c$ in collector circuit branch 20. As a result a substantially constant collector to emitter current may be maintained through secondary phase splitter transistor element Q51 for equalizing the emitter current densities from the emitters of current mirror transistor elements Q5 and Q51.

The emitter follower current sourcing transistor element Q40 in effect compensates for imbalance in the collector loads and therefore the collector currents of the dual phase splitter transistor elements. The emitter follower compensates in the collector circuit of the variable collector load phase splitter transistor element (secondary transmitter element) by actively inserting compensating current. It is an active compensating function that maintains balance between dual transistor elements coupled in current mirror configuration.

Base drive for the low impedance current sourcing transistor element Q40 is obtained by coupling its base node to the collector node of input transistor element Q6. In the case of output buffer circuit 10 the base node of current sourcing transistor Q40 is coupled to the collector of a stage which affords one voltage drop $V_{be}$ difference between the base of input transistor element Q6 and the base of the secondary phase splitter transistor element Q51. The voltage difference should therefore be one $V_{be}$ between the collector of the selected input transistor element Q6 and the collector of the secondary transistor element Q51 when the transistor elements are conducting.

For example if an additional input stage of current amplification were included between the input transistor element Q6 and the dual phase splitter transistor elements Q5 and Q51, the voltage drop between the bases of input transistor Q6 and secondary phase splitter transistor Q51 is 2 $V_{be}$'s. The base node of the current sourcing transistor element may still be coupled to the collector node of input transistor element Q6 provided a Darlington transistor pair is used for the current sourcing transistor element Q40 thereby maintaining the difference of two voltage drops $V_{be}$ between the collector nodes of input transistor element Q6 and secondary phase splitter transistor element Q51 when the transistors are on. Alternatively, diode stacking may be used with the emitter follower current sourcing transistor to maintain the comparable voltage differences between the base nodes and the collector nodes.

In the preferred embodiment the emitter area of the supplemental phase splitter transistor element (SPS) is slightly larger than the emitter area of the output phase splitter transistor element (OPS). For example, the emitter area of the SPS may be in the order of 5% larger than the emitter area of the OPS. The advantage of this arrangement is that under equal collector loads, the slightly smaller emitter area of the output phase splitter transistor element (primary or reference transistor element) will support a slightly greater current density. The emitter current density of the secondary phase splitter transistor element is slightly lower. Therefore, any tendency toward current hogging will occur at the secondary transistor element where the emitter follower current sourcing transistor element Q40 can provide compensating mirroring current. Thus, slightly favoring one of the dual transistor elements directs current hogging where it is best compensated, namely at the secondary phase splitter transistor element.

Figure 2:
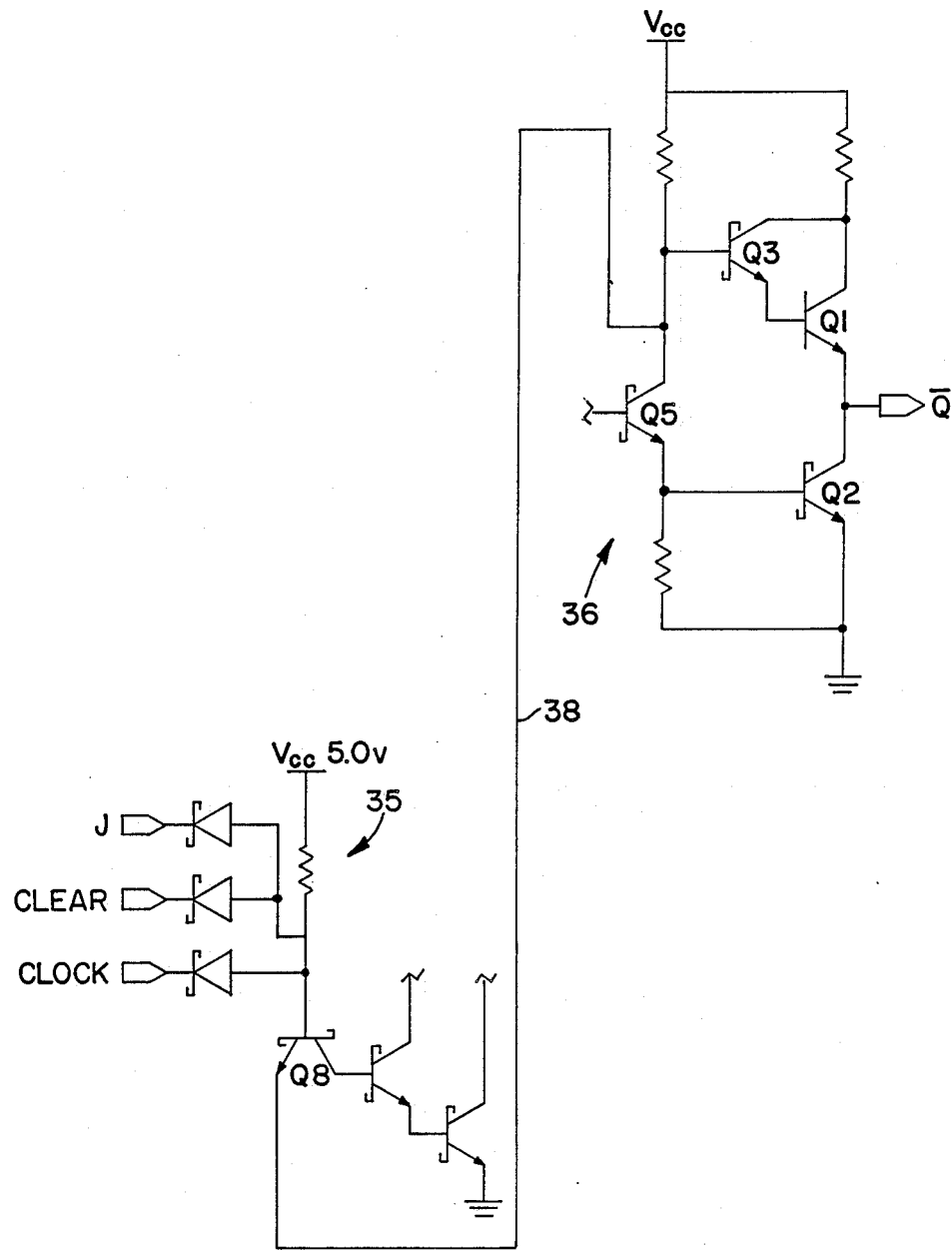
FIG. 2 is a fragmentary simplified schematic diagram of relevant portions of a prior art JK flip flop illustrating the problem of feedback transistor breakdown.

A problem encountered in JK flip flop circuits which the present invention addresses is illustrated in the fragmentary portions of a prior art JK flip flop circuit illustrated in FIG. 2. One of the two input circuits of the JK flip flop, namely the J input circuit 35 is shown along with one of the two output buffer circuits of the JK flip flop circuit, namely the $\overline{Q}$ output circuit 36. The cross feedback line 38 provides a cross feedback circuit coupling of signals from the cross feedback transistor Q8 to the collector of the output phase splitter transistor Q5 of the conventional single phase splitter transistor element $\overline{Q}$ output buffer circuit 36. A similar cross feedback circuit is coupled between the K input circuit and the Q output buffer circuit, not shown. The cross feedback circuit coupling using cross feedback transistors Q8 achieves the desired logical operation of the JK flip flop circuit in accordance with Table 1.

A difficulty with this circuit arrangement however is that upon transition from low to high to potential at one of the outputs for example the $\overline{Q}$ output and during the period when the output $\overline{Q}$ is at high potential, the emitter of feedback transistor Q8 is also pulled up to the high level potential, substantially at the power supply potential $V_{cc}$. The high potential at the emitter of feedback transistor Q8 relative to the lower base and collector potentials may result in breakdown and reverse conduction through the feedback transistor Q8. High voltage breakdown from the emitter to collector of feedback transistor Q8, referred to as emitter/collector breakdown may pulldown the voltage at the output $\overline{Q}$ below the high level potential output specifications for the circuit. Breakdown may also occur from the emitter to base of the feedback transistor, referred to as emitter/base breakdown. Not only does feedback transistor breakdown result in loss of the high level potential specification for the output and consequent spurious signals, but also degradation of the switching speed or maximum frequency $F_{max}$ of switching operation of the JK flip flop circuit.

Figure 3:
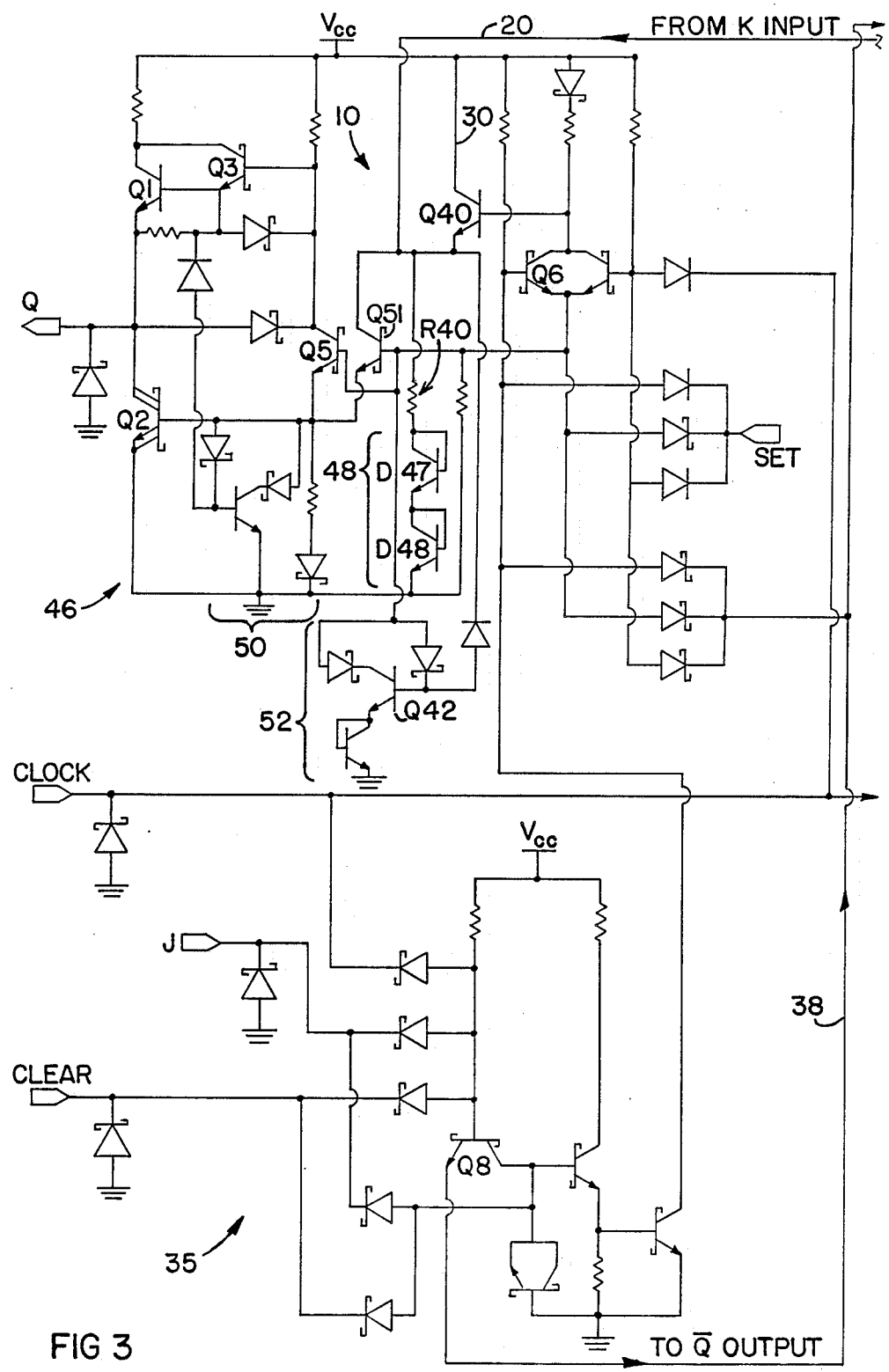
FIG. 3 is a schematic block diagram of one half of a JK flip flop circuit according to the invention.

A fragmentary portion of one half of a JK flip flop showing the left side of the flip flop implementing the circuit of the present invention is illustrated in FIG. 3. As there shown, the non-current hogging phase splitter TTL output circuit 10 of FIG. 1 is incorporated in the Q output circuit 46 over the J input circuit 35. The circuit elements and components according to the invention illustrated in FIG. 1 are indicated by the same reference designations in the Q output circuit 46 of FIG. 3. As a result, the cross feedback signals on the cross feedback circuit line 20 from the K input circuit not shown in FIG. 3 is coupled to the collector node of secondary phase splitter transistor element Q51 only and is isolated from the pullup transistor element Darlington pair Q1, Q3 and the output Q of the Q output circuit 46.

During periods of high potential level at the output Q, the cross feedback transistor Q8 in the K input circuit may be protected from pullup to the high potential level of the power supply $V_{cc}$. This is accomplished by the clamping action of transistor Q40 which clamps the voltage level to which the emitter of the feedback transistor may be pulled up, at a level below the reverse bias which might cause emitter/collector or emitter/base breakdown of the feedback transistor. Emitter follower coupled transistor Q40 also serves as the current sourcing transistor element in the parallel branch 30 of the collector circuit of secondary phase splitter transistor element Q51 and prevents or reduces current hogging as heretofore described.

In the example of FIG. 3, the collector of secondary phase splitter transistor element Q51 is clamped with reference to the power supply voltage $V_{cc}$. The clamping function is provided by the dynamic clamping element Q40. The collector of secondary phase splitter transistor element can alternatively be clamped at the desired voltage level with reference to ground. For example, passive clamping diodes may be "stacked" between the base node of current sourcing transistor Q40 and ground. Dynamic clamping with reference to ground can also be used.

The cross feedback line 38 from the J input circuit 35 is similarly coupled to the collector node of a secondary phase splitter transistor element in the $\overline{Q}$ output circuit, not shown in FIG. 3. A current sourcing transistor element also functioning as a clamp is similarly coupled in parallel at the collector node of the $\overline{Q}$ output circuit secondary phase splitter transistor element.

Other circuit features improving the performance of the output circuit 46 are also illustrated in FIG. 3. A bias circuit 48 coupled to the emitter of current sourcing transistor element Q40 maintains the current sourcing transistor element Q40 slightly on for responding to AC switching requirements. The bias circuit 48 is provided by the resistor R40 and base collector shorted diodes D47 and D48 coupled in series between the emitter node of the current sourcing transistor element Q40 and ground.

A standard AC Miller killer 50 is provided at the base node of the pulldown transistor element Q2 to accelerate turn off of pulldown transistor element Q2 during transition from low to high potential at the Q output. Such an AC Miller killer circuit is described for example in the Robert W. Bechdolt U.S. Pat. No. 4,321,490 issued in 1982. In a novel feature of the present circuit an additional AC Miller killer circuit 52 is coupled at the base nodes of the dual phase splitter transistor elements Q5 and Q51. The active discharge transistor element Q42 of the additional AC Miller killer circuit 52 is driven at the base using emitter voltage feedback current from the current sourcing transistor element Q40 to accelerate turn off of the dual phase splitter transistor elements Q5 and Q51 during transition from low to high potential at the Q output of output circuit 46. The CLOCK, CLEAR and SET pins of the JK flip flop circuit are also shown.

A summary of the beneficial effects of the present invention in improving the operating characteristics of the JK flip flop circuit are as follows.

(1) The non-current hogging dual phase splitter transistor element circuit incorporated in the Q and $\overline{Q}$ output circuits emitter/collector and emitter/base breakdown of the cross feedback transistor elements.

(2) The maximum switching speed $F_{max}$ during AC performance of the JK flip flop is improved and increased for example by 10%.

(3) A faster rise time at the output Q or $\overline{Q}$ is achieved during transition from low to high potential because of the reduced loading on the output phase splitter transistor element collector node. All JK cross feedback control current is directed to the secondary phase splitter transistor element collector node.

(4) Faster turn off of the phase splitter transistor elements Q5 and Q51 during transition from low to high potential at the output is achieved by the additional AC Miller killer coupled at the bases of the phase splitter transistor elements.

(5) Fall time at the Q and $\overline{Q}$ outputs during transition from high to low potential is also reduced because of the clamping function performed by the current sourcing transistor element Q40. This clamp limits the high potential level from which the transition to low level potential commences.

(6) Output noise at the Q and $\overline{Q}$ slave output circuits of the JK flip flop is isolated from the J and K "master" inputs by the separate dual phase splitter transistor elements Q51.

(7) With faster rise time on the collector node of transistor element Q51, feedback response time is reduced and overall clocking speed of the JK flip flop is improved.

(8) Feedback from the Q or $\overline{Q}$ output through the output phase splitter transistor element Q5 may be used to accelerate turn on of the pulldown transistor element Q2 without current hogging, maintaining $\beta^2$ amplification and acceleration of sinking current.

(9) Generally full current mirroring is permitted at the dual phase splitter transistor elements Q5 and Q51 without problems presented by current hogging. The output phase splitter transistor element Q5 can operate as a fixed current source at the output Q while the feedback collector current to the secondary phase splitter transistor element Q51 may vary.

(10) Generally, the non-current hogging dual phase splitter transistor element Q and $\overline{Q}$ output circuits, with cross feedback from the J and K input circuits through the secondary phase splitter transistor elements, improves both AC and DC performance.

While the invention has been described with reference to a particular example embodiment it is apparent that the non-current hogging dual transistor element current mirror TTL circuit is useful in a variety of applications where a supplemental circuit operating through a phase splitter transistor element should be isolated from the pullup transistor element and output. The invention is also applicable generally where it is desirable to avoid current hogging between dual transistors coupled in current mirror configuration. The invention is therefore intended to cover all modifications and equivalents within the scope of the following claims.

I claim:

1. A TTL circuit having dual transistor elements with respective base and emitter nodes coupled in current mirror configuration, said dual transistor elements having separately coupled collector nodes coupled respectively to separate collector current sources, comprising:

a low impedance current sourcing active transistor element operatively coupled in emitter follower configuration in parallel with one of the collector current sources at a collector node of one of the dual transistor elements, said emitter follower configuration active transistor element supplying compensating collector current for mirroring of the currents at the respective emitter nodes of the dual transistor elements substantially without base drive current hogging between the dual transistor elements.

2. A TTL circuit comprising:

dual transistor elements including a primary reference transistor element and a secondary transistor element, said reference and secondary transistor elements having base nodes and emitter nodes coupled in current mirror configuration;

said reference transistor element having a collector node coupled to a substantially constant collector load and collector current thereby providing a reference emitter current density;

said secondary transistor element having a collector node coupled to a variable collector load generating variable collector current;

and a low impedance current sourcing active transistor element operatively coupled in emitter follower configuration at the collector node of the secondary transistor element in parallel with the variable collector load, said emitter follower configuration active transistor element supplying compensating collector current for mirroring of the currents at the respective emitter nodes of the dual transistor elements substantially without base drive current hogging between the dual transistor elements.

3. The TTL circuit of claim 2 wherein the variable collector load at the collector node of the secondary transistor element comprises a supplemental circuit which operates without direct connection to the collector node of the reference transistor element.

4. A TTL circuit having an output for delivering signals of high and low potential, a pulldown transistor element for sinking current from the output to ground, a pullup transistor element for sourcing current to the output from a power supply, and dual phase splitter transistor elements operatively coupled with respective base nodes and emitter nodes in current mirror configuration, a first one of said phase splitter transistor elements being coupled to the pullup and pulldown transistor elements for controlling the respective conducting states of the pullup and pulldown transistor elements, said first phase splitter transistor element having a collector node coupled to the pullup transistor element, and a second one of the phase splitter transistor elements having a collector node operatively coupled in a supplemental circuit without direct connection to the collector node of the first phase splitter transistor element and the pullup transistor element, the improvement comprising:

a low impedance current sourcing active transistor element operatively coupled in emitter follower configuration at the collector node of the second dual phase splitter transistor element in parallel with the supplemental circuit, said emitter follower configuration active transistor element supplying compensating collector current for mirroring of the currents at the respective emitter nodes of the dual phase splitter transistor elements substantially without base drive current hogging between the dual phase splitter transistor elements.

5. The TTL circuit of claim 4 comprising an input transistor element having an emitter node operatively coupled to the base nodes of the dual phase splitter transistor elements and wherein the base node of the current sourcing active transistor element is coupled to the collector node of the input transistor element for base drive.

6. A TTL circuit having an output for delivering data signals of high and low potential, a pulldown transistor element for sinking current from the output to ground, a pullup transistor element for sourcing current to the output from a power supply, and dual phase splitter transistor elements operatively coupled with respective base nodes and emitter nodes in current mirror configuration, said dual phase splitter transistors including an output phase splitter transistor element operatively coupled to the pullup and pulldown transistor elements for controlling the respective conducting states of the pullup and pulldown transistor elements, said output phase splitter transistor element having a collector node coupled to the pullup transistor element, and at least one secondary phase splitter transistor element having a supplemental circuit coupled to the collector node of the secondary phase splitter transistor element without direct connection to the collector node of the output phase splitter transistor element and the pullup transistor element, the improvement for reducing any current hogging that might occur at the base nodes of the dual phase splitter transistor elements comprising:

a low impedance current sourcing active transistor element operatively coupled in substantial emitter follower configuration at the collector node of the secondary phase splitter transistor element in parallel with the supplemental circuit, said emitter follower configuration active transistor element supplying compensating collector current for mirroring of the currents at the respective emitter nodes of the dual phase splitter transistor elements substantially without base drive current hogging between the dual phase splitter transistor elements.

7. The TTL circuit of claim 6 wherein the TTL circuit comprises an input transistor element operatively coupled to the dual phase splitter transistor elements for receiving and applying input signals of high and low potential, wherein the base node of the current sourcing active transistor element is coupled to the collector node of the input transistor element and wherein the respective base nodes of the dual phase splitter transistor elements are coupled in parallel to the emitter node of the input transistor element.

8. The TTL circuit of claim 6 wherein the emitter area of the secondary phase splitter transistor element is slightly larger than the emitter area of the output phase splitter transistor element.

9. The TTL circuit of claim 6 further comprising an AC Miller killer circuit coupled to the base nodes of the dual phase splitter transistor elements to accelerate turn off of the dual phase splitter transistor elements during transition from low to high potential at the output.

10. The TTL circuit of claim 9 wherein the AC Miler killer circuit comprises an active discharge transistor element having the base node of the active discharge transistor element coupled to the emitter node of the emitter follower configuration current sourcing active transistor element.

11. The TTL circuit of claim 6 wherein the collector node of the secondary phase splitter transistor element is coupled in a supplemental circuit which delivers variable collector current to the secondary phase splitter transistor element.

12. The TTL circuit of claim 11 wherein the supplemental circuit comprises a cross feedback circuit of a JK flip flop circuit.

13. The TTL circuit of claim 6 further comprising a bias circuit coupled to the emitter follower configuration current sourcing active transistor element to maintain the current sourcing active transistor element at least in a slightly conducting state.

14. A TTL JK flip flop circuit having first and second master input circuits for receiving input signals of high and low potential, first and second slave output buffer circuits having respective inputs operatively coupled to the respective first and second input circuits for controlling the state of the output buffer circuits according to input signals, said first and second output buffer circuits each comprising an output for delivering output signals of high and low potential, pullup transistor element for sourcing current to the output from a power supply, pulldown transistor element for sinking current from the output to low potential, phase splitter transistor element coupled to the input and to the pullup and pulldown transistor elements for controlling the conducting states of the respective pullup and pulldown transistor elements, said flip flop circuit further comprising first and second cross feedback circuits each including a cross feedback transistor element operatively coupled between one of the input circuits and the other of the output buffer circuits, the improvement comprising:

each output buffer circuit comprising dual phase splitter transistor elements including an output phase splitter transistor element operatively coupled to the pullup and pulldown transistor elements of the output buffer circuit for controlling the respective states of the pullup and pulldown transistor elements, and at least one secondary phase splitter transistor element operatively coupled in current mirror configuration with the output phase splitter transistor element, said secondary phase splitter transistor element being coupled at its collector node to the respective cross feedback circuit without direct connection to the pullup transistor element and output, thereby isolating the cross feedback transistor element in the cross feedback circuit from the pullup transistor element and output and avoiding feedback transistor breakdown when the output is at high potential.

15. The TTL JK flip flop circuit of claim 14 further comprising a current sourcing transistor element coupled in substantial emitter follower configuration at the collector node of the secondary phase splitter transistor element for supplying mirroring current through the emitter of the secondary phase splitter transistor element.

16. The TTL JK flip flop circuit of claim 15 wherein the cross feedback circuit comprises a variable collector load at the collector of the secondary phase splitter transistor and wherein the current sourcing transistor is operatively coupled in parallel with the cross feedback circuit at the collector node of the phase splitter transistor element to provide a variable current which varies inversely with the cross feedback circuit collector load current.

17. The TTL JK flip flop circuit of claim 15 wherein the output buffer circuit comprises an input transistor element having an emitter node operatively coupled to the base nodes of the dual phase splitter transistor elements and wherein the base node of the current sourcing transistor element is coupled to the collector node of the input transistor element.

18. The TTL JK flip flop circuit of claim 15 wherein the base node of the current sourcing transistor element is coupled to a current source node of the output buffer circuit out of phase with the input signal.

19. The TTL JK flip flop circuit of claim 15 further comprising a supplemental A.C Miller killer circuit coupled at the base nodes of the dual phase splitter transistor elements for accelerating turn off of the dual phase splitter transistor elements during transition from low to high potential at the output.

20. The TTL JK flip flop circuit of claim 15 wherein the output buffer circuit further comprises a biasing circuit operatively coupled between the emitter node of the current sourcing transistor and ground to maintain the current sourcing transistor at least in a slightly conducting state.

21. A TTL JK flip flop circuit having J and K input circuits for receiving input signals of high and low potential, Q and $\overline{Q}$ output buffer circuits having respective inputs operatively coupled to the respective J and K input circuits for controlling the state of the Q and $\overline{Q}$ output buffer circuits according to the input signals, each said Q and $\overline{Q}$ output buffer circuit comprising an output for delivering output signals of high and low potential, pullup transistor element for sourcing current to the output from a power supply, pulldown transistor element for sinking current from the output to low potential, and phase splitter transistor element coupled to the input and to the pullup and pulldown transistor elements for controlling the conducting states of the respective pullup and pulldown transistor elements, said TTL flip flop circuit further comprising a first cross feedback circuit including a first cross feedback transistor element operatively coupled between the J input circuit and a collector node of the phase splitter transistor element of the $\overline{Q}$ output buffer circuit, and a second cross feedback circuit including a second cross feedback transistor element operatively coupled between the K input circuit and a collector node of the phase splitter transistor element of the Q output buffer circuit, the improvement comprising:

each Q and $\overline{Q}$ output buffer circuit comprising dual phase splitter transistor elements including an output phase splitter transistor element operatively coupled to the pullup and pulldown transistor elements for controlling the respective conducting states of the pullup and pulldown transistor elements, and at least one secondary phase splitter transistor element operatively coupled in current mirror configuration with the output phase splitter transistor element, said secondary phase splitter transistor element having a collector node without direct connection to the pullup transistor element and output, a cross feedback circuit and cross feedback transistor element being operatively coupled to the collector node of the secondary phase splitter transistor element thereby separating the cross feedback transistor element from the pullup transistor element and output of the output buffer circuit to prevent feedback transistor breakdown when the output is at high potential.

22. The TTL JK flip flop circuit of claim 21, wherein each Q and $\overline{Q}$ output buffer circuit further comprises a current sourcing transistor element operatively coupled in parallel with the cross feedback circuit at the collector node of the secondary phase splitter transistor element for supplying variable mirroring current which varies inversely with the cross feedback circuit collector load current to provide substantially equal emitter current densities at the emitters of the dual phase splitter transistor elements without current hogging at the base drives of the dual phase splitter transistor elements.

23. The TTL JK flip flop circuit of claim 22 wherein each output buffer circuit further comprises a current sourcing transistor bias circuit operatively coupled between the emitter of the current sourcing transistor element and ground for maintaining the current sourcing transistor clement in a slightly conducting state.

24. The TTL JK flip flop circuit of claim 22 wherein each output buffer circuit comprises an input transistor having an emitter coupled to the bases of the dual phase splitter transistor element and wherein the base of the current sourcing transistor element is coupled to the collector of the input transistor element.

25. The TTL JK flip flop circuit of claim 22 wherein the emitter area of the supplemental phase splitter transistor element is slightly larger than the emitter area of the output phase splitter transistor element.

* * * * *